United States Patent
Dean et al.

(10) Patent No.: US 9,519,319 B2
(45) Date of Patent: Dec. 13, 2016

(54) SELF-SUPPORTING THERMAL TUBE STRUCTURE FOR ELECTRONIC ASSEMBLIES

(71) Applicant: SanDisk Enterprise IP LLC, Milpitas, CA (US)

(72) Inventors: David Dean, Litchfield Park, AZ (US); Robert W. Ellis, Phoenix, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/244,716

(22) Filed: Apr. 3, 2014

(65) Prior Publication Data

US 2015/0261265 A1 Sep. 17, 2015

Related U.S. Application Data

(60) Provisional application No. 61/970,845, filed on Mar. 26, 2014, provisional application No. 61/953,688, filed on Mar. 14, 2014.

(51) Int. Cl.
*G01R 31/20* (2006.01)
*G06F 1/20* (2006.01)
(Continued)

(52) U.S. Cl.
CPC ............... *G06F 1/20* (2013.01); *G01R 1/0408* (2013.01); *G01R 31/2601* (2013.01);
(Continued)

(58) Field of Classification Search
CPC ..... G06F 1/20; H05K 7/20709; G01R 1/0408; G01R 31/2601; G01R 31/2891; G01R 31/2834; G01R 31/2887
(Continued)

(56) References Cited

U.S. PATENT DOCUMENTS 4,839,587 A 6/1989 Flatley et al.
4,916,652 A 4/1990 Schwarz et al.
(Continued)

FOREIGN PATENT DOCUMENTS

CN 201 655 782 11/2010
CN 102 446 873 5/2012
(Continued)

OTHER PUBLICATIONS

International Search Report and Written Opinion dated Dec. 16, 2014, received in International Patent Application No. PCT/US2014/059114, which corresponds to U.S. Appl. No. 14/135,223, 9 pages (Dean).

(Continued)

*Primary Examiner* — Son Le
*Assistant Examiner* — Raul Rios Russo
(74) *Attorney, Agent, or Firm* — Morgan, Lewis & Bockius LLP

(57) ABSTRACT

Various embodiments described herein include systems, methods and/or devices for dissipating heat generated by electronic components in an electronic system (e.g., a memory system that includes closely spaced memory modules). In one aspect, an electronic assembly includes a first circuit board, a second circuit board flexibly coupled to the first circuit board, a connecting module coupled to the second circuit board, and a fastener. The fastener is configured to couple the first circuit board to the connecting module such that the first circuit board and the second circuit board are substantially parallel and are separated by a space, wherein the space forms at least part of a channel that is configured to direct airflow through the space between the first circuit board, second circuit board, and connecting module.

24 Claims, 11 Drawing Sheets

(51) Int. Cl.

| | | |
|---|---|---|
| *G01R 31/28* | (2006.01) | |
| *G01R 1/04* | (2006.01) | |
| *G01R 31/26* | (2014.01) | |
| *H01L 23/467* | (2006.01) | |
| *H05K 1/14* | (2006.01) | |
| *H05K 7/20* | (2006.01) | |
| *G01R 31/00* | (2006.01) | |
| *H01L 23/498* | (2006.01) | |
| *H05K 1/02* | (2006.01) | |

(52) U.S. Cl.
CPC ........ *G01R 31/2891* (2013.01); *H01L 23/467* (2013.01); *H01L 23/4985* (2013.01); *H05K 1/147* (2013.01); *H05K 7/20727* (2013.01); *G01R 31/2834* (2013.01); *G01R 31/2887* (2013.01); *H01L 23/49833* (2013.01); *H01L 2924/0002* (2013.01); *H05K 1/0201* (2013.01); *H05K 2201/042* (2013.01)

(58) Field of Classification Search
USPC ................ 324/71, 378, 403, 415, 425, 500, 537,324/750.16, 750.25
See application file for complete search history.

(56) References Cited

U.S. PATENT DOCUMENTS

| | | | |
|---|---|---|---|
| 5,210,680 A | 5/1993 | Scheibler | |
| 5,489,805 A | 2/1996 | Hackitt et al. | |
| 5,519,847 A | 5/1996 | Fandrich et al. | |
| 5,530,705 A | 6/1996 | Malone | |
| 5,537,555 A | 7/1996 | Landry | |
| 5,551,003 A | 8/1996 | Mattson et al. | |
| 5,628,031 A | 5/1997 | Kikinis et al. | |
| 5,657,332 A | 8/1997 | Auclair et al. | |
| 5,666,114 A | 9/1997 | Brodie et al. | |
| 5,705,850 A | 1/1998 | Ashiwake et al. | |
| 5,708,849 A | 1/1998 | Coke et al. | |
| 5,763,950 A | 6/1998 | Fujisaki et al. | |
| 5,828,649 A | 10/1998 | Ohta et al. | |
| 5,923,532 A * | 7/1999 | Nedved ................ | H05K 7/1418 211/41.17 |
| 5,943,692 A | 8/1999 | Marberg et al. | |
| 5,946,190 A | 8/1999 | Patel et al. | |
| 5,973,920 A | 10/1999 | Altic et al. | |
| 5,982,664 A | 11/1999 | Watanabe | |
| 6,000,006 A | 12/1999 | Bruce et al. | |
| 6,008,987 A | 12/1999 | Gale et al. | |
| 6,009,938 A | 1/2000 | Smith et al. | |
| 6,016,560 A | 1/2000 | Wada et al. | |
| 6,018,304 A | 1/2000 | Bessios | |
| 6,031,730 A | 2/2000 | Kroske | |
| 6,058,012 A | 5/2000 | Cooper et al. | |
| 6,061,245 A | 5/2000 | Ingraham et al. | |
| 6,070,074 A | 5/2000 | Perahia et al. | |
| 6,084,773 A | 7/2000 | Nelson et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh et al. | |
| 6,311,263 B1 | 10/2001 | Barlow et al. | |
| 6,335,862 B1 | 1/2002 | Koya | |
| 6,411,511 B1 | 6/2002 | Chen | |
| 6,442,076 B1 | 8/2002 | Roohparvar | |
| 6,449,625 B1 | 9/2002 | Wang | |
| 6,484,224 B1 | 11/2002 | Robins et al. | |
| 6,507,101 B1 | 1/2003 | Morris | |
| 6,516,437 B1 | 2/2003 | Van Stralen et al. | |
| 6,528,878 B1 | 3/2003 | Daikoku et al. | |
| 6,541,310 B1 | 4/2003 | Lo et al. | |
| 6,570,762 B2 | 5/2003 | Cross et al. | |
| 6,618,249 B2 | 9/2003 | Fairchild | |
| 6,621,705 B1 | 9/2003 | Ballenger et al. | |
| 6,678,788 B1 | 1/2004 | O'Connell | |
| 6,757,768 B1 | 6/2004 | Potter et al. | |
| 6,762,942 B1 | 7/2004 | Smith | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,871,257 B2 | 3/2005 | Conley et al. | |
| 6,892,801 B1 | 5/2005 | Kim | |
| 6,895,464 B2 | 5/2005 | Chow et al. | |
| 6,934,152 B1 | 8/2005 | Barrow | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 6,997,720 B2 | 2/2006 | Perret et al. | |
| 7,020,017 B2 | 3/2006 | Chen et al. | |
| 7,030,482 B2 | 4/2006 | Haines | |
| 7,032,123 B2 | 4/2006 | Kane et al. | |
| 7,043,505 B1 | 5/2006 | Teague et al. | |
| 7,075,788 B2 | 7/2006 | Larson et al. | |
| 7,079,972 B1 | 7/2006 | Wood et al. | |
| 7,100,002 B2 | 8/2006 | Shrader et al. | |
| 7,111,293 B1 | 9/2006 | Hersh et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,233,501 B1 | 6/2007 | Ingalz | |
| 7,280,364 B2 * | 10/2007 | Harris ..................... | G06F 1/184 257/E23.099 |
| 7,328,377 B1 | 2/2008 | Lewis et al. | |
| 7,474,528 B1 | 1/2009 | Olesiewicz | |
| 7,480,147 B2 | 1/2009 | Hoss et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,571,277 B2 | 8/2009 | Mizushima | |
| 7,574,554 B2 | 8/2009 | Tanaka et al. | |
| 7,595,994 B1 | 9/2009 | Sun | |
| 7,596,643 B2 | 9/2009 | Merry et al. | |
| 7,599,182 B2 | 10/2009 | Sun | |
| 7,623,343 B2 | 11/2009 | Chen | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,954,041 B2 | 5/2011 | Hong et al. | |
| 7,959,445 B1 * | 6/2011 | Daily ................... | H01R 12/716 439/65 |
| 7,961,462 B2 | 6/2011 | Hernon | |
| 7,971,112 B2 | 6/2011 | Murata | |
| 7,974,368 B2 | 7/2011 | Shieh et al. | |
| 7,978,516 B2 | 7/2011 | Olbrich | |
| 7,980,863 B1 | 7/2011 | Holec et al. | |
| 7,989,709 B2 | 8/2011 | Tsao | |
| 7,996,642 B1 | 8/2011 | Smith | |
| 8,000,096 B2 | 8/2011 | Nemoz et al. | |
| 8,006,161 B2 | 8/2011 | Lestable et al. | |
| 8,032,724 B1 | 10/2011 | Smith | |
| 8,069,390 B2 | 11/2011 | Lin | |
| 8,190,967 B2 | 5/2012 | Hong et al. | |
| 8,198,539 B2 | 6/2012 | Otoshi et al. | |
| 8,208,252 B2 | 6/2012 | Tolliver | |
| 8,254,181 B2 | 8/2012 | Hwang et al. | |
| 8,305,103 B2 | 11/2012 | Kang et al. | |
| 8,312,349 B2 | 11/2012 | Reche et al. | |
| 8,373,986 B2 | 2/2013 | Sun | |
| 8,405,985 B1 | 3/2013 | Reynov et al. | |
| 8,412,985 B1 | 4/2013 | Bowers et al. | |
| 8,472,183 B1 | 6/2013 | Ross et al. | |
| 8,477,495 B2 | 7/2013 | Sun | |

(56) References Cited

U.S. PATENT DOCUMENTS

| | | |
|---|---|---|
| 8,570,740 B2 | 10/2013 | Cong et al. |
| 8,599,560 B2 | 12/2013 | Wu et al. |
| 9,089,073 B2 | 7/2015 | Reynov et al. |
| 2002/0008963 A1* | 1/2002 | DiBene, II .............. G06F 1/18 361/720 |
| 2002/0024846 A1 | 2/2002 | Kawahara et al. |
| 2002/0076951 A1 | 6/2002 | Roy |
| 2002/0083299 A1 | 6/2002 | Van Huben et al. |
| 2002/0123259 A1 | 9/2002 | Yatskov et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid |
| 2003/0088805 A1 | 5/2003 | Majni et al. |
| 2003/0093628 A1 | 5/2003 | Matter et al. |
| 2003/0184970 A1 | 10/2003 | Bosch et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0073829 A1 | 4/2004 | Olarig |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0218367 A1 | 11/2004 | Lin et al. |
| 2004/0237018 A1 | 11/2004 | Riley |
| 2004/0246662 A1 | 12/2004 | Thurk et al. |
| 2005/0009382 A1 | 1/2005 | Burmeister et al. |
| 2005/0013120 A1 | 1/2005 | Liu |
| 2005/0060456 A1 | 3/2005 | Shrader et al. |
| 2005/0060501 A1 | 3/2005 | Shrader |
| 2005/0082663 A1 | 4/2005 | Wakiyama et al. |
| 2005/0114587 A1 | 5/2005 | Chou et al. |
| 2005/0152112 A1 | 7/2005 | Holmes et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0042291 A1 | 3/2006 | Petroski |
| 2006/0053246 A1 | 3/2006 | Lee |
| 2006/0067066 A1 | 3/2006 | Meier et al. |
| 2006/0085671 A1 | 4/2006 | Majni et al. |
| 2006/0133041 A1* | 6/2006 | Belady ................... G06F 1/20 361/704 |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0259528 A1 | 11/2006 | Dussud et al. |
| 2007/0001282 A1 | 1/2007 | Kang et al. |
| 2007/0011413 A1 | 1/2007 | Nonaka et al. |
| 2007/0057686 A1 | 3/2007 | Suga et al. |
| 2007/0058446 A1 | 3/2007 | Hwang et al. |
| 2007/0061597 A1 | 3/2007 | Holtzman et al. |
| 2007/0074850 A1 | 4/2007 | Peschl |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0097653 A1 | 5/2007 | Gilliland et al. |
| 2007/0113019 A1 | 5/2007 | Beukema |
| 2007/0121297 A1 | 5/2007 | Uchizono et al. |
| 2007/0133312 A1 | 6/2007 | Roohparvar |
| 2007/0145996 A1* | 6/2007 | Shiao ................... H05K 1/144 361/748 |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0208901 A1 | 9/2007 | Purcell et al. |
| 2007/0211426 A1 | 9/2007 | Clayton et al. |
| 2007/0211436 A1 | 9/2007 | Robinson et al. |
| 2007/0216005 A1 | 9/2007 | Yim et al. |
| 2007/0216009 A1 | 9/2007 | Ng |
| 2007/0230111 A1 | 10/2007 | Starr et al. |
| 2007/0234143 A1 | 10/2007 | Kim |
| 2007/0245061 A1 | 10/2007 | Harriman |
| 2007/0246189 A1 | 10/2007 | Lin et al. |
| 2007/0247805 A1 | 10/2007 | Fujie et al. |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019095 A1 | 1/2008 | Liu |
| 2008/0019182 A1 | 1/2008 | Yanagidaira et al. |
| 2008/0022163 A1 | 1/2008 | Tanaka et al. |
| 2008/0026637 A1 | 1/2008 | Minich |
| 2008/0043435 A1 | 2/2008 | Yip et al. |
| 2008/0052435 A1 | 2/2008 | Norwood et al. |
| 2008/0052446 A1 | 2/2008 | Lasser et al. |
| 2008/0068796 A1 | 3/2008 | Pav et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0116571 A1 | 5/2008 | Dang et al. |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0158818 A1 | 7/2008 | Clidaras et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0236791 A1 | 10/2008 | Wayman |
| 2008/0252324 A1 | 10/2008 | Barabi et al. |
| 2008/0254573 A1 | 10/2008 | Sir et al. |
| 2008/0266807 A1 | 10/2008 | Lakin et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0291636 A1 | 11/2008 | Mori et al. |
| 2009/0003058 A1 | 1/2009 | Kang |
| 2009/0037652 A1 | 2/2009 | Yu et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0190308 A1 | 7/2009 | Bhattacharya et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0273898 A1 | 11/2009 | Imsand |
| 2009/0296466 A1 | 12/2009 | Kim et al. |
| 2009/0296486 A1 | 12/2009 | Kim et al. |
| 2009/0302458 A1 | 12/2009 | Kubo et al. |
| 2009/0309214 A1 | 12/2009 | Szewerenko et al. |
| 2009/0319864 A1 | 12/2009 | Shrader |
| 2010/0008034 A1 | 1/2010 | Hinkle |
| 2010/0061151 A1 | 3/2010 | Miwa et al. |
| 2010/0073860 A1 | 3/2010 | Moriai et al. |
| 2010/0073880 A1 | 3/2010 | Liu |
| 2010/0091463 A1 | 4/2010 | Buresch et al. |
| 2010/0103737 A1 | 4/2010 | Park |
| 2010/0118496 A1 | 5/2010 | Lo |
| 2010/0161936 A1 | 6/2010 | Royer et al. |
| 2010/0164525 A1 | 7/2010 | Han et al. |

(56) References Cited

U.S. PATENT DOCUMENTS

| | | |
|---|---|---|
| 2010/0199125 A1 | 8/2010 | Reche |
| 2010/0202196 A1 | 8/2010 | Lee et al. |
| 2010/0208521 A1 | 8/2010 | Kim et al. |
| 2010/0224985 A1 | 9/2010 | Michael et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0296255 A1 | 11/2010 | Maloney |
| 2010/0319986 A1 | 12/2010 | Bleau et al. |
| 2010/0328887 A1 | 12/2010 | Refai-Ahmed et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0132000 A1 | 6/2011 | Deane et al. |
| 2011/0173378 A1 | 7/2011 | Filor et al. |
| 2011/0182035 A1 | 7/2011 | Yajima |
| 2011/0188205 A1 | 8/2011 | MacManus et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2011/0299244 A1 | 12/2011 | Dede et al. |
| 2011/0317359 A1 | 12/2011 | Wei et al. |
| 2012/0014067 A1 | 1/2012 | Siracki |
| 2012/0064781 A1 | 3/2012 | Krishnan et al. |
| 2012/0096217 A1 | 4/2012 | Son et al. |
| 2012/0110250 A1 | 5/2012 | Sabbag et al. |
| 2012/0151253 A1 | 6/2012 | Horn |
| 2012/0170224 A1 | 7/2012 | Fowler et al. |
| 2012/0195126 A1 | 8/2012 | Roohparvar |
| 2012/0201007 A1 | 8/2012 | Yeh et al. |
| 2012/0239976 A1 | 9/2012 | Cometti et al. |
| 2012/0284587 A1 | 11/2012 | Yu et al. |
| 2012/0293962 A1 | 11/2012 | McCluskey et al. |
| 2012/0327598 A1 | 12/2012 | Nakayama |
| 2013/0155800 A1 | 6/2013 | Shim et al. |
| 2013/0181733 A1 | 7/2013 | Kikuchi et al. |
| 2013/0285686 A1 | 10/2013 | Malik et al. |
| 2013/0294028 A1 | 11/2013 | Lafont et al. |
| 2013/0307060 A1 | 11/2013 | Wang et al. |
| 2014/0055944 A1 | 2/2014 | McCabe et al. |
| 2014/0071614 A1 | 3/2014 | Kaldani |
| 2014/0153181 A1 | 6/2014 | Peng et al. |
| 2014/0182814 A1 | 7/2014 | Lin |

FOREIGN PATENT DOCUMENTS

| | | |
|---|---|---|
| DE | 199 10 500 A1 | 10/2000 |
| DE | 2005 063281 | 7/2007 |
| EP | 0 600 590 A1 | 6/1994 |
| EP | 0 989 794 A2 | 3/2000 |
| EP | 1 465 203 A1 | 10/2004 |
| EP | 1 990 921 A2 | 11/2008 |
| EP | 2 066 158 A2 | 6/2009 |
| EP | 2 395 827 A2 | 12/2011 |
| EP | 2 600 700 A1 | 6/2013 |
| FR | 2560731 | 9/1985 |
| JP | 06006064 | 1/1994 |
| JP | 2002-532806 | 10/2002 |
| JP | 2003 188565 | 7/2003 |
| WO | WO 88 07193 | 3/1988 |
| WO | WO 03/094586 A1 | 11/2003 |
| WO | WO 2004/086827 A2 | 10/2004 |
| WO | WO 2007/036834 | 4/2007 |
| WO | WO 2007/080586 | 7/2007 |
| WO | WO 2008/121553 | 7/2007 |
| WO | WO 2008/013850 A2 | 1/2008 |
| WO | WO 2008/121577 | 10/2008 |
| WO | WO 2009/028281 | 3/2009 |
| WO | WO 2009/032945 | 3/2009 |
| WO | WO 2009/058140 | 5/2009 |
| WO | WO 2009/084724 | 7/2009 |
| WO | WO 2009/134576 | 7/2009 |
| WO | WO 2013/080341 | 6/2013 |

OTHER PUBLICATIONS

International Search Report and Written Opinion dated Nov. 20, 2014, received in International Patent Application No. PCT/US2014/020290, which corresponds to U.S. Appl. No. 13/791,797, 21 pages (Dean).

International Search Report and Written Opinion dated Dec. 23, 2014, received in International Patent Application No. PCT/US2014/042772, which corresponds to U.S. Appl. No. 13/922,105, 10 pages (Dean).

International Search Report and Written Opinion dated Apr. 28, 2015 received in International Patent Application No. PCT/US2015/014563, which corresponds to U.S. Appl. No. 14/170,247, 9 pages (Ellis).

International Search Report and Written Opinion dated May 8, 2015, received in International Patent Application No. PCT/US2015/017722 which corresponds to U.S. Appl. No. 14/277,716, 9 pages (Dean).

International Search Report and Written Opinion dated May 13, 2015, received in International Patent Application No. PCT/US2015/017724, which corresponds to U.S. Appl. No. 14/244,734, 12 pages, (Dean).

International Search Report and Written Opinion dated May 18, 2015, received in International Patent Application No. PCT/US2015/016656, which corresponds to U.S. Appl. No. 14/275,690, 14 pages (Wright).

International Search Report and Written Opinion dated May 28, 2015, received in International Patent Application No. PCT/US2015/017729, which corresponds to U.S. Appl. No. 14/244,745, 14 pages (Ellis).

Invitation to Pay Additional Fees dated Jul. 25, 2014, received in International Patent Appiication No. PCT/US2014/021290, which corresponds to U.S. Appl. No. 13/791,797, 8 pages (Dean).

International Search Report and Written Opinion dated Sep. 12, 2014, received in International Patent Appiication No. PCT/US2014/043146.

Barr, "Introduction to Watchdog Timers" Oct. 2001, 3 pgs.

Canim, "Buffered Bloom Filters on Solid State Storage," ADMS*10, Singapore, Sep. 13-17, 2010, 8 pgs.

Kang, "A Multi-Channel Architecture for High-Performance NAND Flash-Based Storage system," J. Syst. Archit., vol. 53, Issue 9, Sep. 2007, 15 pgs.

Kim, "A Space-Efficient Flash Translation Layer for CompactFlash Systems," May 2002, IEEE vol. 48, No, 2, 10 pgs.

Lu, "A Forest-structured Bloom Filter with Flash Memory," MSST 2011, Denver, CO, May 23-27, 2011, article, 6 pgs.

Lu, "A Forest-structured Bloom Filter with Flash Memory," MSST 2011, Denver, CO. May 23-27, 2011, presentation siides, 25 pgs.

McLean, "Information Technology-AT Attachment with Packet Interface Extension," Aug. 19, 1998, 339 pgs.

Microchip Technology, "Section 10. Watchdog Timer and Power-Saving Modes," 2005, 14 pages.

Park et al. "A High Performance Controller for NAND Flash-Based Solid State Disk (NSSD)," Proceedings of Non-Volatile Semiconductor Memory Workshop, Feb. 2006, 4 pgs.

Zeidman, "Verilog Designer's Library," 1999, 9 pgs.

International Search Report and Written Opinion, dated Mar. 19, 2009 received in International Patent Application No. PCT/US08/88133, which corresponds to U.S. Appl. No. 12/082,202, 7 pgs (Prins).

International Search Report and Written Opinion, dated Mar. 19, 2009, received in International Patent Application No. PCT/US08/88136, which corresponds to U.S. Appl. No. 12/082,205, 7 pgs. (Olbrich).

International Search Report and Written Opinion dated Feb. 26. 2009, received in International Patent Application No. PCT/US08/88146, which corresponds to U.S. Appl. No. 12/082,221, 10 pgs (Prins).

International Search Report and Written Opinion dated Feb. 27, 2009, received in International Patent Application No. PCT/US2008/088154, which corresponds to U.S. Appl. No. 12/082,207, 8 pgs (Prins).

(56) References Cited

OTHER PUBLICATIONS

International Search Report and Written Opinion dated Feb. 13, 2009, received in International Patent Application No. PCT/US08/88164, which corresponds to U.S. Appl. No. 12/082,220, 6 pgs (Olbrich).
International Search Report and Written Opinion dated Feb. 18, 2009, received in International Patent Application No. PCT/US08/88206, which corresponds to U.S. Appl. No. 12/082,205, 8 pgs (Prins).
International Search Report and Written Opinion dated Feb. 19, 2009, received in International Patent Application No. PCT/US08/88217, which corresponds to U.S. Appl. No. 12/082,204, 7 pgs (Olbrich).
International Search Report and Written Opinion dated Feb. 13, 2009 received in International Patent Application No. PCT/US08/88229, which corresponds to U.S. Appl. No. 12/082,223, 7 pgs (Olbrich).
International Search Report and Written Opinion dated Feb. 19, 2009, received in International Patent Application No. PCT/US08/88232, which corresponds to U.S. Appl. No. 12/082,222, 8 pgs (Olbrich).
International Search Report and Written Opinion dated Feb. 19, 2009, received in International Patent Application No. PCT/US08/88236, which corresponds to U.S. Appl. No. 12/082,203, 7 pgs (Olbrich).
International Search Report and Written Opinen dated Oct. 27, 2011, received in International Patent Application No. PCT/US2011/028637, which corresponds to U.S. Appl. No. 12/726,200,11 pgs (Olbrich).
European Search Report dated Feb. 23, 2012, received in European Patent Application No. 08866997.3, which corresponds to U.S. Appl. No. 12/082,207, 6 pgs (Prins).
Office Action dated Apr. 18, 2012, received in Chinese Patent Application No. 200880127623.8, which corresponds to U.S. Appl. No. 12/082,207, 12 pgs (Prins).
Office Action dated Dec. 31, 2012, received in Chinese Patent Application No. 200880127623.8, which corresponds to U.S. Appl. No. 12/082,207, 9 pgs (Prins).
Notification of the Decision to Grant a Patent Right for Patent for Invention dated Jul. 4, 2013, received in Chinese Patent Application No. 200880127623.8, which corresponds to U.S. Appl. No. 12/082,207, 1 pg (Prins).
Office Action dated Jul. 24, 2012, received in Japanese Patent Application No. JP 2010-540863, 3 pgs (Prins).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated Aug. 31, 2012, received in International Patent Application PCT/US2012/042764, which corresponds to U.S. Appl. No. 13/285,873, 12 pgs (Frayer).
International Search Report and Written Opinion dated Mar. 4, 2013, received in PCT/US2012/042771, which corresponds to U.S. Appl. No. 13/286,012, 14 pgs (Stonelake).
International Search Report and Written Opinion dated Sep. 26, 2012, received in International Patent Application No. PCT/US2012/042775, which corresponds to U.S. Appl. No. 13/285,892, 8 pgs (Weston-Lewis et al.).
International Search Report and Written Opinion dated Jun. 6, 2013, received in International Patent Application No. PCT/US2012/059447, which corresponds to U.S. Appl. No. 13/602,031, 12 pgs (Tai).
International Search Report and Written Opinion dated Jun. 6, 2013, received in International Patent Application No. PCT/US2012/059453, which corresponds to U.S. Appl. No. 13/602,039, 12 pgs (Frayer).
International Search Report, and Written Opinion dated Feb. 14, 2013, received in International Patent Application No. PCT/US2012/059459, which corresponds to U.S. Appl. No. 13/602,047, 9 pgs (Tai).
International Search Report and Written Opinion dated May 23, 2013, received in International Patent Application No. PCT/US2012/065914, which corresponds to U.S. Appl. No. 13/679,963, 7 pgs (Frayer).
International Search Report and Written Opinion dated Apr. 5, 2013, received in International Patent Application No. PCT/US2012/065916, which corresponds to U.S. Appl. No. 13/679,969 7 pgs (Frayer).
International Search Report and Written Opinion dated Jun. 17, 2013, received in International Patent Application No. PCT/US2012/065019, which corresponds to U.S. Appl. No. 13/679,970, 8 pgs (Frayer).

\* cited by examiner

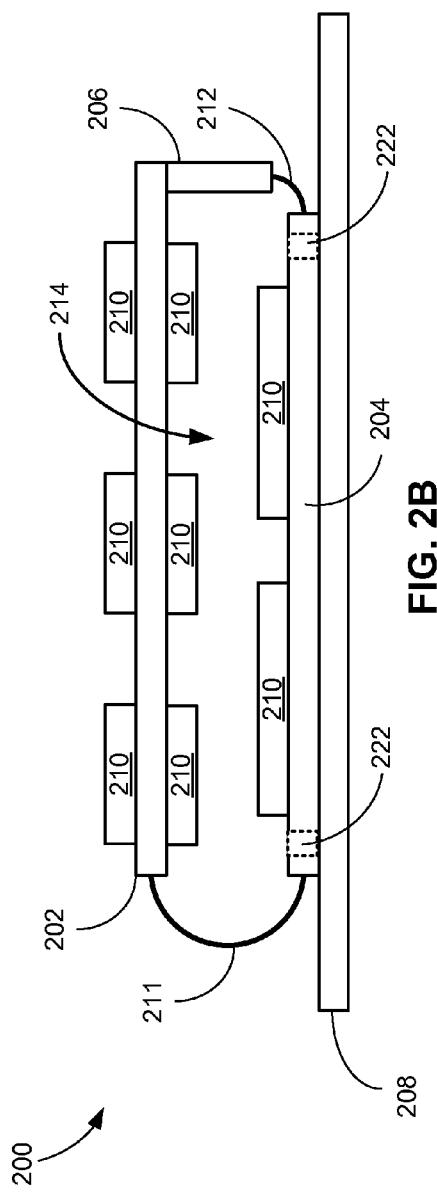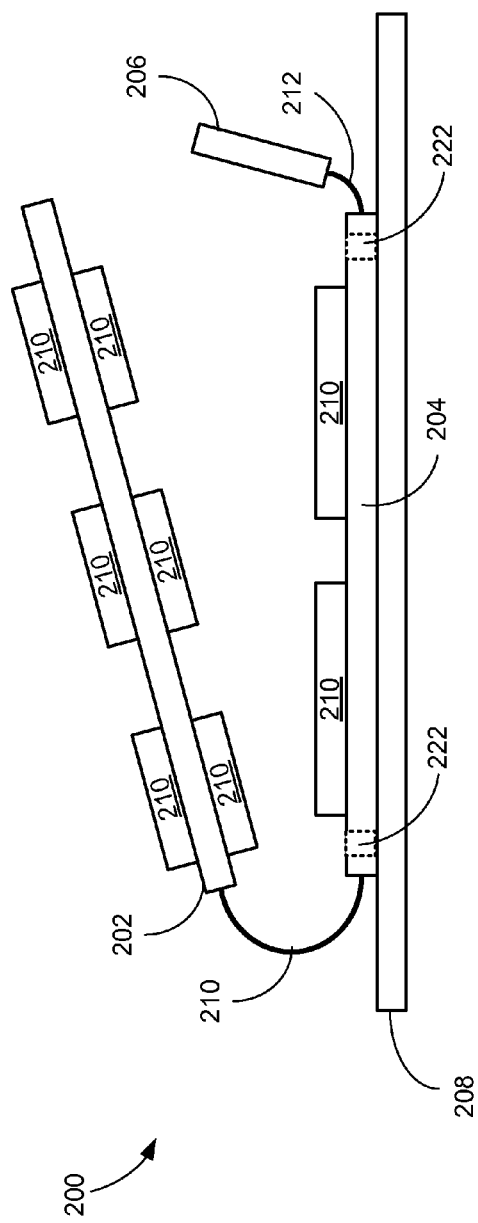

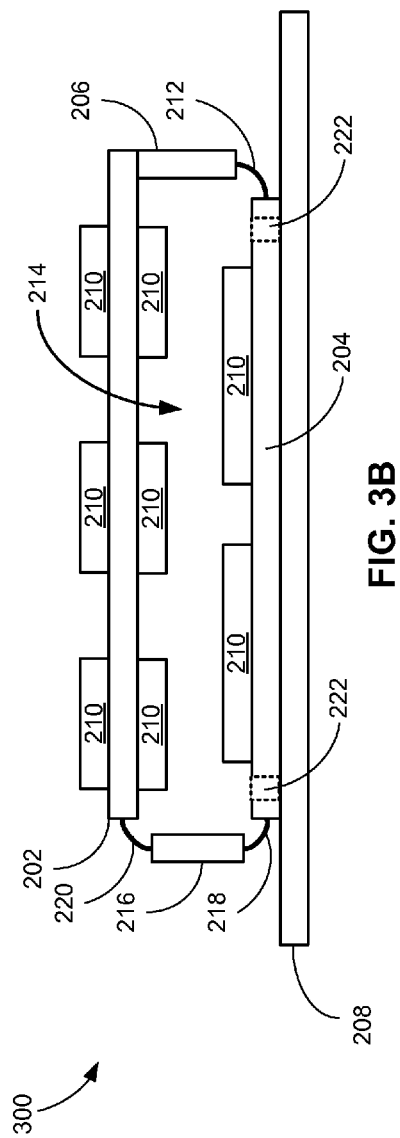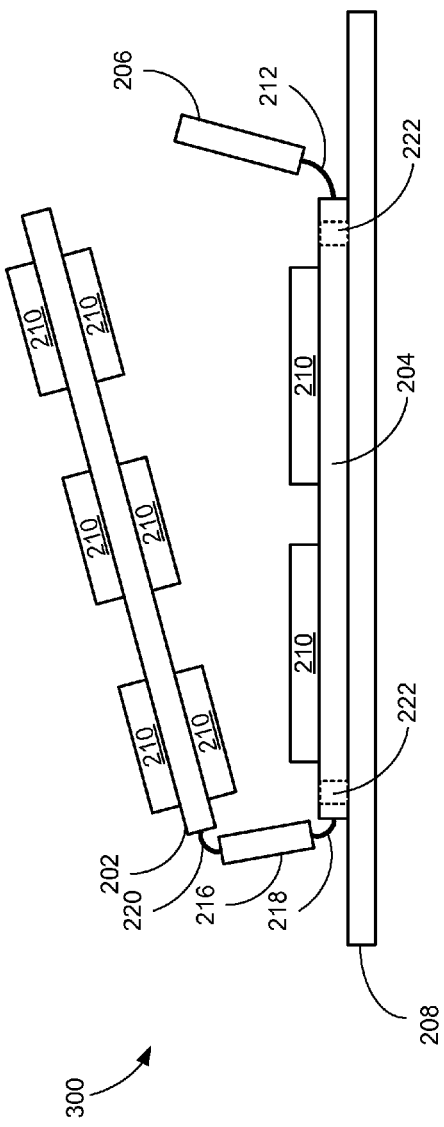

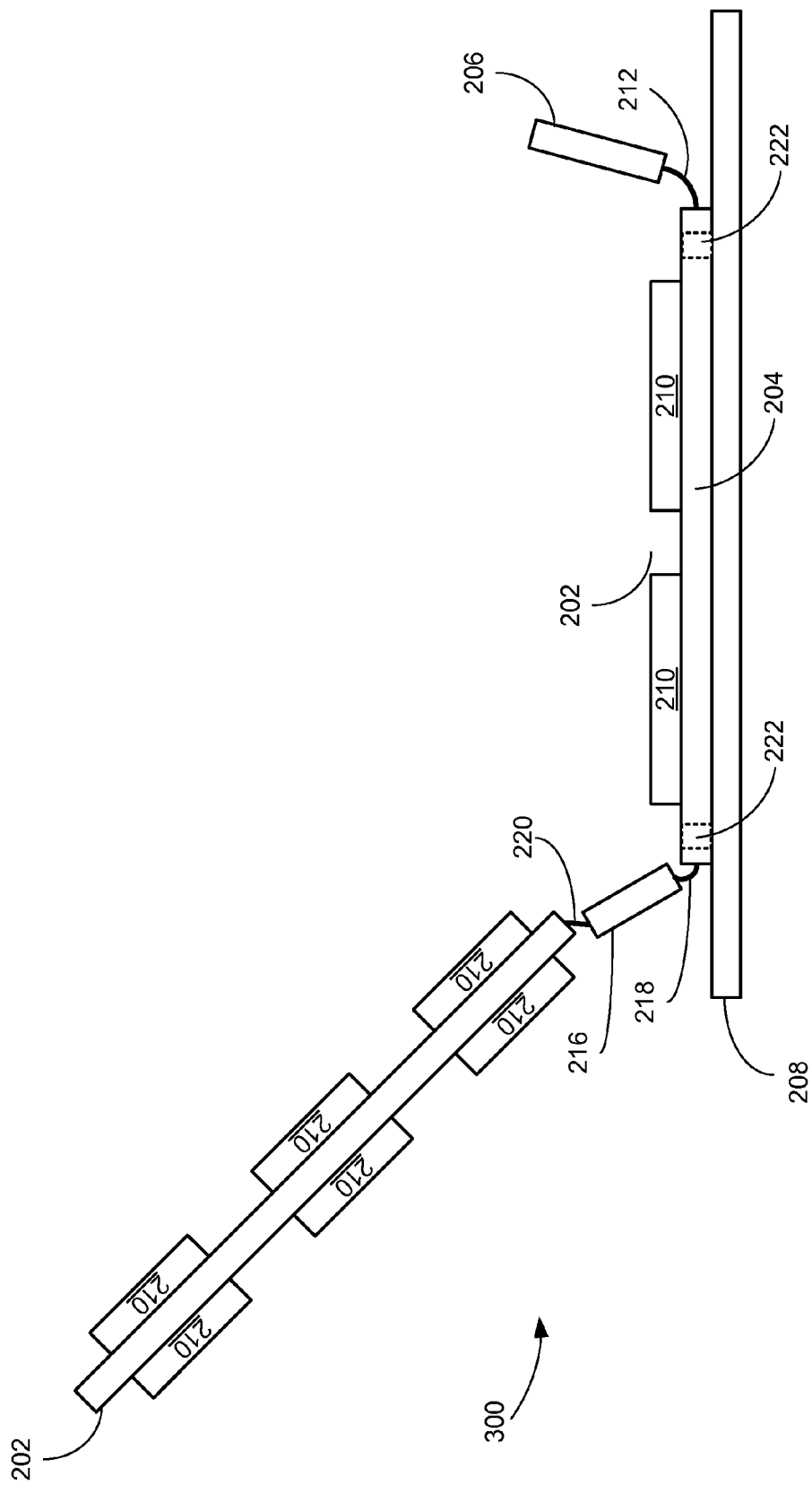

SELF-SUPPORTING THERMAL TUBE STRUCTURE FOR ELECTRONIC ASSEMBLIES

RELATED APPLICATIONS

This application claims priority to U.S. Provisional Patent Application Ser. No. 61/970,845, filed Mar. 26, 2014, and titled "Self-Supporting Thermal Tube Structure for Electronic Assemblies," and U.S. Provisional Patent Application Ser. No. 61/953,688, filed Mar. 14, 2014, and titled "Self-Supporting Thermal Tube Structure for Electronic Assemblies," both of which are incorporated herein by reference in their entirety.

TECHNICAL FIELD

The disclosed embodiments relate generally to heat dissipation, and in particular, to dissipating heat generated by electronic components in electronic systems.

BACKGROUND

Many electronic systems include semiconductor memory modules, such as solid state drives (SSDs), dual in-line memory modules (DIMMs), and small outline-DIMMs, all of which utilize memory cells to store data as an electrical charge or voltage. Improvements in storage density of these modules have been brought about by increasing the density of the memory cells on each individual memory component using enhanced manufacturing techniques. Additionally, the storage density of these modules has also been increased by including more memory components in each memory device or module using advanced board-level packaging techniques. However, as storage density has increased, so has the overall heat generated from the modules. Such heat generation is particularly problematic in blade server systems, where high-density SSDs and DIMMs are frequently accessed for memory read and write operations. In the absence of efficient heat dissipation mechanisms, this increased heat can ultimately lead to reduced performance or failure of either individual memory cells or the entire module.

To dissipate heat generated by tightly packed memory components, a memory module may make use of heat sinks that are coupled to the semiconductor memory devices or the module. Heat sinks are typically mounted on top of the memory devices or the memory module. Airflow from fans may be routed through or past the heat sinks to help dissipate the heat. However, given the increasingly compact form factor of the memory modules, the combined heat dissipation effects of the heat sinks and the airflow is often insufficient. Thus, cooling systems normally have to be larger and/or operate their fans at higher speeds, which results in noisier, less efficient, and costlier systems that do not sufficiently address the issue of non-uniform heat dissipation throughout each memory module. Therefore, it would be desirable to provide a cooling system that addresses the above mentioned problems.

SUMMARY

Heat generating electronic devices, such as memory modules, processors, and the like, are typically mounted to circuit boards. As noted above, many different techniques for dissipating heat from these electronic devices have been used. For example, fans are employed to blow or draw air over the heat generating components in order to keep them cool. Managing the airflow over these components, including managing the speed and direction of the air flow, can be crucial in ensuring that the airflow is able to remove enough of the waste heat to keep the electronic components at a suitable temperature. One way to carefully control the airflow (and ensure that it is delivered to the right components) is to use ducting to direct the air. For example, a duct may direct forced air over a heat sink of a memory module.

Described herein are systems and methods that use the circuit boards on which heat generating components are mounted as one or more walls of an airflow channel. For example, instead of providing a duct that directs airflow to an element on a circuit board, the present application describes that one or more circuit boards can be assembled to form a channel through which air is forced in order to cool the very components mounted on the one or more circuit boards. Moreover, the assemblies described herein are self-supporting, obviating the need for additional mounting rails and brackets in order to form the channel.

In one aspect, an electronic assembly includes a first circuit board, a second circuit board flexibly coupled to the first circuit board, a connecting module coupled to the second circuit board, and a fastener. The fastener is configured to couple the first circuit board to the connecting module such that the first circuit board and the second circuit board are substantially parallel and are separated by a space, wherein the space forms at least part of a channel that is configured to direct airflow through the space between the first circuit board, second circuit board, and the connecting module.

Other embodiments and advantages may be apparent to those skilled in the art in light of the descriptions and drawings in this specification.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIGS. 2B-2D are side views of an exemplary electronic assembly that forms a self supporting channel, in accordance with some embodiments.

FIGS. 3B-3D are side views of another exemplary electronic assembly that forms a self supporting channel, in accordance with some embodiments.

Figure 1:
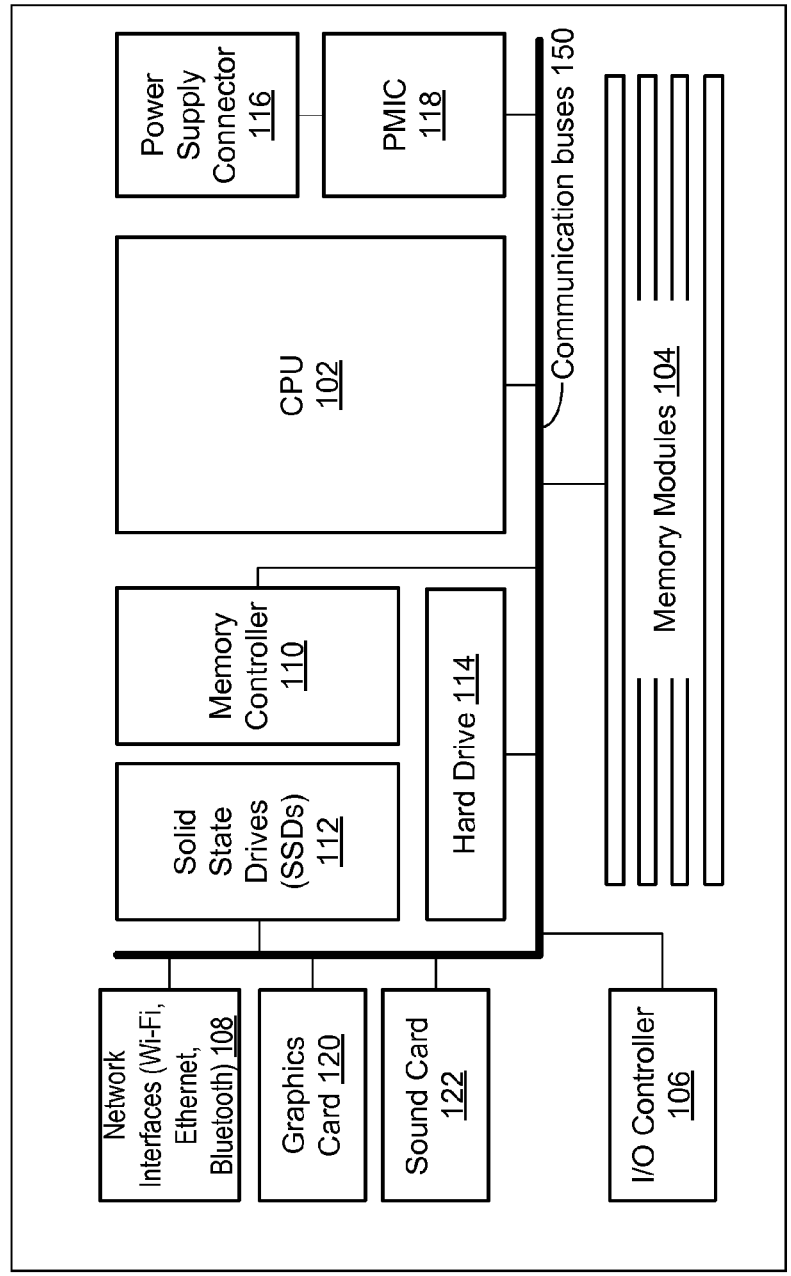
FIG. 1 is a block diagram a typical computational device of an exemplary system module in, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used by, or integrated into, electronic assemblies. In particular, the electronic assemblies, and the channel that is formed by the electronic assemblies, described herein facilitate dissipation of heat generated by electronic components in the electronic systems.

While the embodiments described below primarily describe memory systems, the present inventions are not limited to such. In fact, the present invention applies equally to an electronic system that requires heat dissipation—particularly those that include multiple heat generating components mounted on one or more circuit boards.

According to some embodiments, an electronic assembly for dissipating heat includes a first circuit board, a second circuit board flexibly coupled to the first circuit board, a connecting module coupled to the second circuit board, and a fastener. The fastener is configured to couple the first circuit board to the connecting module such that the first circuit board and the second circuit board are substantially parallel and are separated by a space, wherein the space forms at least part of a channel that is configured to direct airflow through the space between the first circuit board, second circuit board, and connecting module.

In some embodiments, the first circuit board is flexibly coupled to the second circuit board with a flexible interconnect. In some embodiments, the flexible interconnect electrically couples the first circuit board to the second circuit board. In some embodiments, a first side of the channel comprises the connecting module, and a second side of the channel comprises the flexible interconnect.

In some embodiments, the first circuit board is flexibly coupled to the second circuit board with one or more flexible interconnects and one or more additional circuit boards. In some embodiments, the second circuit board is flexibly coupled to the connecting module. In some embodiments, the second circuit board is flexibly coupled to the connecting module with a flexible interconnect. In some embodiments, the flexible interconnect electrically couples the second circuit board to the connecting module.

In some embodiments, the fastener is affixed to the first circuit board. In some embodiments, the fastener is affixed to the connecting module. In some embodiments, the fastener comprises a first sub-fastener affixed to the first circuit board and a second sub-fastener affixed to the connecting module. In some embodiments, the first and second sub-fasteners each comprise one or more solder pads.

In some embodiments, the first circuit board includes a hole in a substrate of the first circuit board, and the connecting module includes a protrusion configured to mate with the hole in the first circuit board. In some embodiments, the connecting module includes a hole in a substrate of the connecting module, and the first circuit board includes a protrusion configured to mate with the hole in the connecting module. In some embodiments, the first circuit board includes a notch in a substrate of the first circuit board, and the connecting module includes a protrusion configured to mate with the notch in the first circuit board. In some embodiments, the connecting module includes a notch in a substrate of the connecting module, and the first circuit board includes a protrusion configured to mate with the notch in the connecting module.

In some embodiments, the fastener is configured to mechanically and electrically couple the first circuit board to the second circuit board. In some embodiments, the second circuit board includes one or more second fasteners configured to couple the second circuit board to a base board.

According to some embodiments, a method of manufacturing an electronic assembly for dissipating heat includes providing an electronic assembly. The electronic assembly includes a first circuit board, a second circuit board flexibly coupled to the first circuit board, a connecting module coupled to the second circuit board, and a fastener. The first circuit board is coupled to the connecting module with the fastener, such that the first circuit board and the second circuit board are substantially parallel and separated by a space, wherein the space forms at least part of a channel that is configured to direct airflow through the space between the first circuit board, second circuit board, and connecting module.

In some embodiments, the method further comprises, prior to coupling the first circuit board to the connecting module, while the first circuit board and the second circuit board are not substantially parallel, coupling the second circuit board to a base circuit board, and manipulating the electronic assembly so as to cause the first circuit board to be positioned substantially parallel to the second circuit board, wherein manipulating the electronic assembly so as to cause the first circuit board to be positioned substantially parallel to the second circuit board causes at least a portion of a first flexible interconnect coupling the first circuit board and the second circuit board to be deformed.

In some embodiments, the connecting module is flexibly coupled to the second circuit board, and the method further includes, prior to manipulating the first circuit board, manipulating the electronic assembly so as to cause the connecting module to be positioned substantially perpendicular to the second circuit board, wherein manipulating the electronic assembly causes at least a portion of a second flexible interconnect coupling the connecting module to the second circuit board to be deformed.

Some embodiments provide an electronic assembly for dissipating heat. The electronic assembly includes a first circuit board; a second circuit board flexibly coupled to the first circuit board; a connecting module coupled to the second circuit board; and a fastener. At least one of the first circuit board, second circuit board, and connecting module includes one or more of (i) solid state drives (SSDs), (ii) energy hold capacitor circuitry, and (iii) one or more three-dimensional (3D) memory devices. The fastener is configured to couple the first circuit board to the connecting module such that the first circuit board and the second circuit board are substantially parallel and are separated by a space. The space is configured to channel airflow between the first circuit board, second circuit board, and connecting module.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

FIG. 1 is a block diagram of an exemplary system module 100 in a typical computational device in accordance with some embodiments. The system module 100 in this computational device includes at least a central processing unit (CPU) 102, memory modules 104 for storing programs, instructions and data, an input/output (I/O) controller 106, one or more communication interfaces such as network interfaces 108, and one or more communication buses 150 for interconnecting these components. In some embodiments, the I/O controller 106 allows the CPU 102 to communicate with an I/O device (e.g., a keyboard, a mouse, a track-pad, etc.) via a universal serial bus interface (or any other suitable wired or wireless interface). In some embodiments, the network interfaces 108 include one or more interfaces for Wi-Fi, Ethernet, and/or Bluetooth networks, each allowing the computational device 100 to exchange data with an external source, such as a server or another computational device. In some embodiments, the communication buses 150 include circuitry (sometimes called a chipset) that interconnects and controls communications among various system components included in the system module.

In some embodiments, the memory modules 104 include high-speed random access memory, such as DRAM, SRAM, DDR RAM or other random access solid state memory devices. Volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive elements, active elements, or both. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements included in a single device, such as memory elements located within and/or over the same substrate or in a single die, may be distributed in a two- or three-dimensional manner (such as a two dimensional (2D) memory array structure or a three dimensional (3D) memory array structure).

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer on which the material layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, including a bit line and a word line.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked planes of memory devices. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single plane, sometimes called a horizontal (e.g., x-z) plane for ease of discussion. Alternatively, the memory elements may be connected together to extend through multiple parallel planes. Other three dimensional configurations can be envisioned wherein some NAND strings contain memory elements in a single plane of memory elements (sometimes called a memory level) while other strings contain memory elements which extend through multiple parallel planes (sometimes called parallel memory levels). Three dimensional memory arrays may also be designed in a NOR configuration and in a ReRAM configuration.

A monolithic three dimensional memory array is one in which multiple planes of memory elements (also called multiple memory levels) are formed above and/or within a single substrate, such as a semiconductor wafer, according to a sequence of manufacturing operations. In a monolithic 3D memory array, the material layers forming a respective memory level, such as the topmost memory level, are located on top of the material layers forming an underlying memory level, but on the same single substrate. In some embodiments, adjacent memory levels of a monolithic 3D memory array optionally share at least one material layer, while in other embodiments adjacent memory levels have intervening material layers separating them.

In contrast, two dimensional memory arrays may be formed separately and then integrated together to form a non-monolithic 3D memory device in a hybrid manner. For example, stacked memories have been constructed by forming 2D memory levels on separate substrates and integrating the formed 2D memory levels atop each other. The substrate of each 2D memory level may be thinned or removed prior to integrating it into a 3D memory device. As the individual memory levels are formed on separate substrates, the resulting 3D memory arrays are not monolithic three dimensional memory arrays.

Further, more than one memory array selected from 2D memory arrays and 3D memory arrays (monolithic or hybrid) may be formed separately and then packaged together to form a stacked-chip memory device. A stacked-chip memory device includes multiple planes or layers of memory devices, sometimes called memory levels.

The term "three-dimensional memory device" (or 3D memory device) is herein defined to mean a memory device having multiple layers or multiple levels (e.g., sometimes called multiple memory levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

A person skilled in the art will recognize that the invention or inventions descried and claimed herein are not limited to the two dimensional and three dimensional exemplary structures described here, and instead cover all relevant memory structures suitable for implementing the invention or inventions as described herein and as understood by one skilled in the art.

In some embodiments, the memory modules 104 include non-volatile memory, such as one or more magnetic disk storage devices, optical disk storage devices, flash memory devices, or other non-volatile solid state storage devices. In some embodiments, the memory modules 104, or alternatively the non-volatile memory device(s) within memory modules 104, include a non-transitory computer readable storage medium. In some embodiments, memory slots are reserved on the system module 100 for receiving the memory modules 104. Once inserted into the memory slots, the memory modules 104 are integrated into the system module 100.

In many embodiments, the system module 100 further includes one or more components selected from:

a memory controller 110 that controls communication between the CPU 102 and memory components, including the memory modules 104, in the computational device;

solid state drives (SSDs) 112 that apply integrated circuit assemblies to store data in the computational device, and in some embodiments, are based on NAND or NOR memory configurations;

a hard drive 114 that is a conventional data storage device used for storing and retrieving digital information based on electromechanical magnetic disks;

a power supply connector 116 that is electrically coupled to receive an external power supply;

power management integrated circuit (PMIC) 118 that modulates the received external power supply to other desired DC voltage levels, e.g., 5V, 3.3V or 1.8V, as required by various components or circuits within the computational device;

a graphics card 120 that generates a feed of output images to one or more display devices according to their desirable image/video formats; and a sound card 122 that facilitates the input and output of audio signals to and from the computational device under control of computer programs.

It is noted that the one or more communication buses 150 also interconnect and control communications among various system components, including components 110-122 (as well as other components not listed).

Further, one of skill in the art will understand that other non-transitory computer readable storage media can be used. In particular, as new data storage technologies are developed, those new data storage technologies may be used in the memory modules described herein. These new non-transitory computer readable storage media include, but are not limited to, those manufactured from biological materials, nanowires, carbon nanotubes, and individual molecules, even though the respective data storage technologies are currently under development and are yet to be commercialized.

Some of the aforementioned components (or other components not mentioned) generate heat during normal operation, and therefore, are integrated with heat sinks in order to reduce the temperatures of the corresponding components. For example, the solid state drives 112 used in a blade server may have heat sinks mounted on the top of each individual dual in-line memory module (DIMM) or on an electronic assembly containing the DIMMs. Heat generated from electronic components in the DIMMs is conducted to the heat sinks, and dissipated by airflow generated by fans. However, as the data workload in these blade servers increases and the form factor of the DIMMs decreases (e.g., closely placed memory slots in the memory modules 104), it becomes more difficult for conventional heat sinks and high-speed fans to conduct and dissipate the heat effectively. More generally, as the size of electronic components decreases, and more and more electronic components are being placed in close proximity to one another on circuit boards, it becomes more difficult to keep the electronic components sufficiently cool.

To address this issue, the various embodiments described herein describe electronic assemblies that form self-supporting tubes or channels for directing airflow over electronic components of the assembly. In particular, a channel structure helps confine air flow to the space within the channel. Thus, by passing air through the channel (e.g., either by convection, fans, or any other technique), heat can be effectively removed from components that are within the channel, or that are otherwise thermally coupled to the channel (e.g., components that are mounted outside the channel but are thermally coupled to a heat sink within the channel). Because the channel structures confine the airflow to the space within the channel, better cooling performance can be achieved for a given amount of airflow than would otherwise be possible.

Figure 2A:
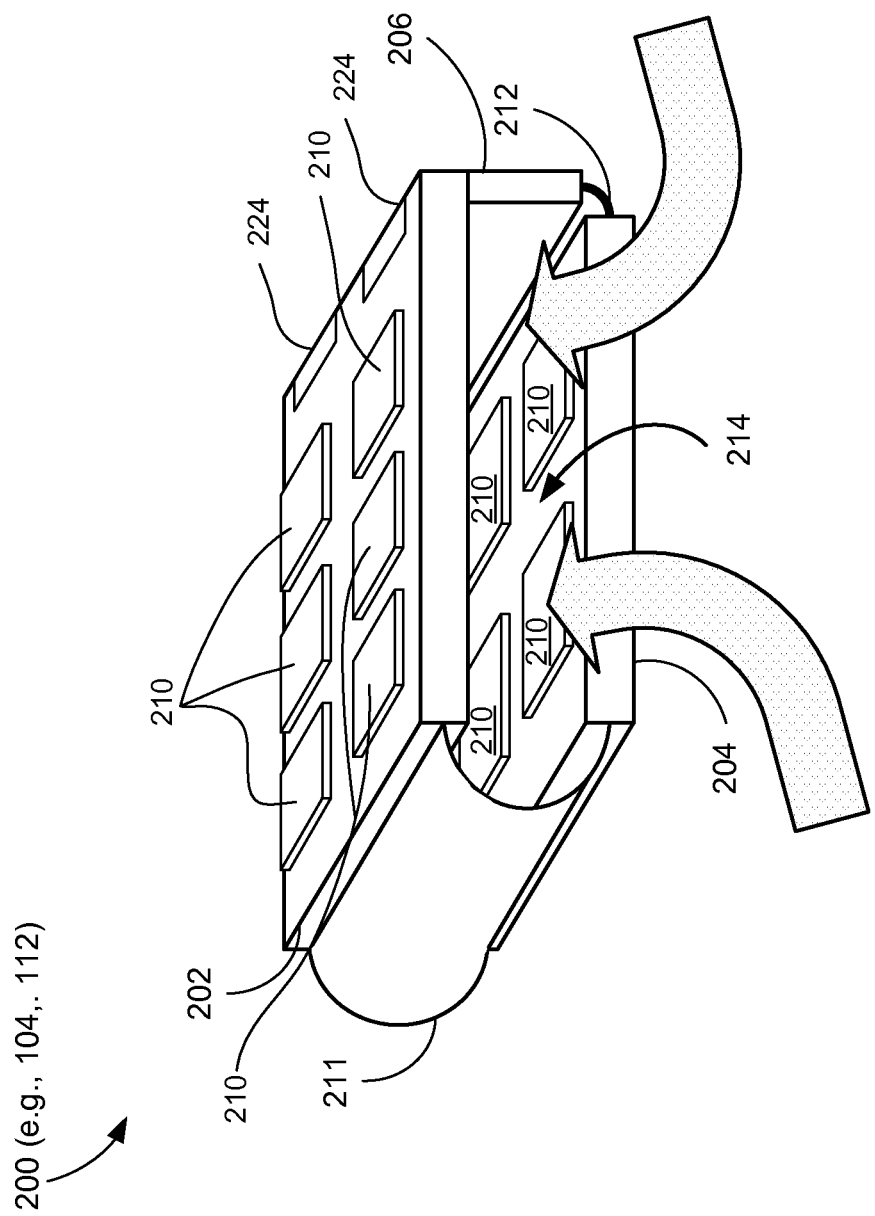
FIG. 2A is an oblique view of an exemplary electronic assembly that forms a self supporting channel, in accordance with some embodiments.

FIG. 2A illustrates an embodiment of an electronic assembly 200 ("assembly 200"), in which the assembly 200 forms a self supporting channel. In particular, the assembly 200 comprises a first circuit board 202, a second circuit board 204, and a connecting module 206. The first and second circuit boards are sometimes referred to herein simply as "boards."

In some embodiments, the connecting module 206 is a third circuit board. In other embodiments, the connecting module 206 is a mechanical structure used to connect the first and second circuit boards to one another as described herein. In the embodiment where the connecting module 206 is a third circuit board, the third circuit board can perform any one of a number of functionalities that are the same as or different from the first and second circuit boards. For example, any one or more of the first, second, and third circuit boards may comprise one or more SSDs.

Figure 7:
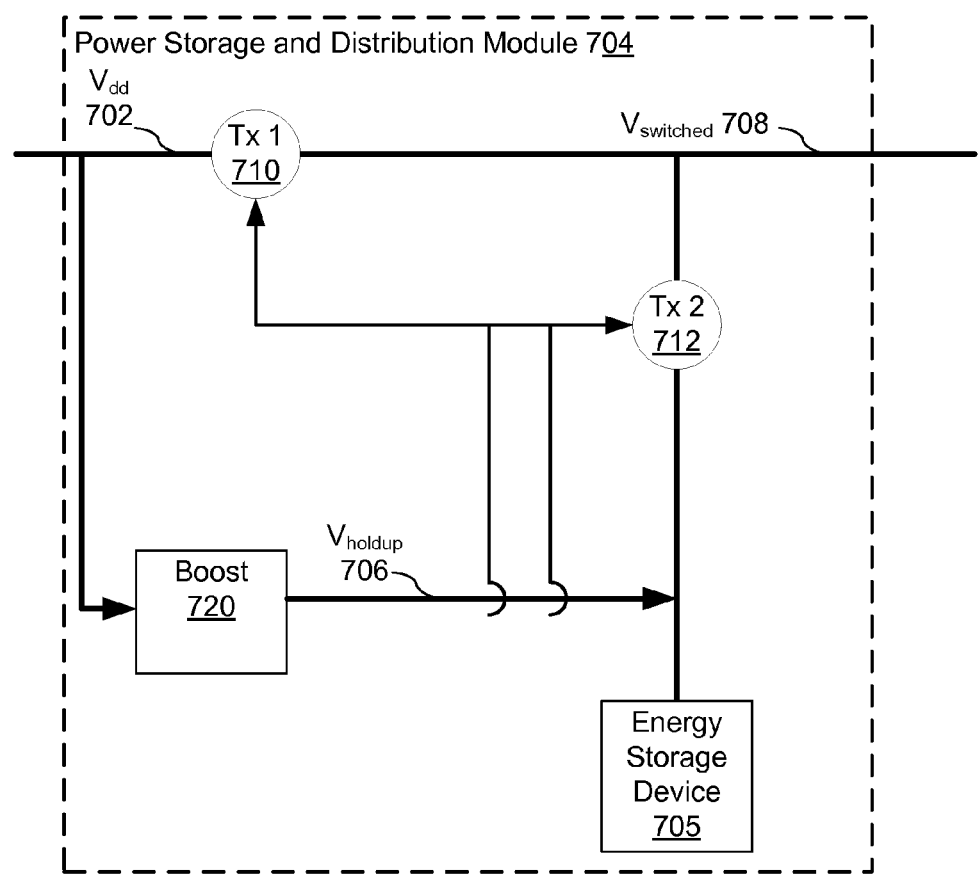
FIG. 7 is a block diagram of energy hold capacitor circuitry, in accordance with some embodiments.

In some embodiments, the third circuit board includes components that generate a significant amount of heat, such as an energy hold capacitor circuitry, such as the power storage and distribution module 704 shown in FIG. 7. In some implementations, the power storage and distribution module 704 includes circuitry for monitoring, storing, and distributing power for a storage device, including monitoring, controlling, charging, and/or testing energy storage device 705. In some embodiments, energy storage device 705 includes one or more capacitors. In other embodiments, energy storage device 705 includes one or more inductors or any other passive elements that store energy. In some implementations, the power storage and distribution module 704 includes boost circuitry 720, the energy storage device 705, transistors 710 and 712, and voltages $V_{dd}$ 702, $V_{holdup}$ 706, and $V_{switched}$ 708. In some implementations, $V_{dd}$ 702 is a voltage supplied by a host system and has a target value of 1.5 volts or less. In some implementations, $V_{holdup}$ 706 is a boosted up voltage from $V_{dd}$ 702 and has a target value of 5.7 volts. In some embodiments, $V_{holdup}$ 706 is used to charge energy storage device 705. In some implementations, $V_{SPD}$ 704 is a voltage supplied for serial presence detect (SPD) functionality and has a target value of 3.3 volts. Further, in some implementations, only one of transistors 710 and 712 is enabled at any one time. For example, whenever transistor 712 is enabled, transistor 710 is disabled (open state), so as to ensure that power from energy storage device 705 is not drained to the host system. In some implementations, both transistor 710 and transistor 712 can be disabled at the same time. In some implementations, energy storage device 705 comprises a power holdup circuit, implemented using one or more capacitors. Further details of a suitable power storage and distribution module 204 can be found in U.S. application Ser. No. 14/135,386 filed on Dec. 19, 2013 and titled Power Failure Architecture and Verification, the entire contents of which are hereby incorporated by reference.

Placing components that generate a significant amount of heat on the third circuit board within the thermal channel allows for more robust heat dissipation and/or cooling of these components. Moreover, placing the heat generating components on a separate board from other components, such as more heat sensitive components, allows for better thermal separation between the different types of components.

The assembly 200 includes one or more electronic components 210 coupled to the boards. In some embodiments, the assembly 200 is configured to be mechanically and/or electrically coupled to a base board (e.g., base board 208, FIG. 2B). In some embodiments, the base board is a mother board of a computer. In some embodiments, the base board is any circuit board to which the assembly 200 is configured to be coupled. In some embodiments, the assembly 200 is a daughter board assembly.

In some embodiments, at least one of the first circuit board 202 and second circuit board 204 include one or more solid state drives (SSDs). In some embodiments, at least one of first circuit board 202 and second circuit board 204 include one or more three-dimensional (3D) memory devices.

In some embodiments, the electronic components 210 are, or include, memory modules. In some embodiments, the electronic components 210 are, or include, processors. In some embodiments, the electronic components 210 are combinations of electronic components (e.g., one or more of the electronic components 210 in FIG. 2A are memory modules, while one or more other electronic components 210 in FIG. 2A are processors, etc.).

The first circuit board, second circuit board, and connecting module 202, 204, 206 are mechanically and/or electrically coupled via one or more flexible interconnects. For example, the assembly 200 includes a flexible interconnect 211 that mechanically and/or electrically couples the first board 202 to the second board 204. The assembly 200 further includes a flexible interconnect 212 that mechanically and/or electrically couples the connecting module 206 to the second board 204. In some embodiments, a flexible interconnect (e.g., the flexible interconnect 211, 212) is a flat interconnection mechanism for electrically connecting two boards (e.g., the first board 202 and the second board 204) or other electronic components or sub-assemblies. The flexible interconnect can be a flexible board, flexible wire array, flexible PCB, flexible flat cable, ribbon cable (e.g., a flexible flat ribbon cable), or a combination thereof. The flexible interconnect can carry electrical signals between two boards (e.g., the first board 202 and the second board 204), or between other electronic components or sub-assemblies. In some embodiments, however, the flexible interconnect does not carry electrical signals between two components.

It will be understood that more or fewer flexible interconnects can be used to couple the boards of an electronic assembly in accordance with the ideas described in the instant application. For example, an electronic assembly may be composed of four (or more) boards where each of the four (or more) boards are coupled to another board with a flexible interconnect. One example of such an assembly is described herein with reference to FIGS. 3A-3D.

Returning to FIG. 2A, the boards 202, 204, 206 have been configured such that a channel 214 is formed by the first board 202, the second board 204, and the connecting module 206. Air can then be forced through this channel (e.g., with a fan, compressed air, convection, etc.) in order to remove heat from the electronic components 210. In particular, the first board 202 and the connecting module 206 are coupled via one or more fastener(s) 224. The one or more fastener(s) 224 include any structure(s), component(s), or device(s) that mechanically and/or electrically couple the first board 202 and the connecting module 206. For example, the one or more fastener(s) 224 can be any of the group consisting of: a clip, a screw, a bolt, a nut, a solder tab and/or soldered connection, adhesive, a slot, a hole, a peg, a protrusion, or the like (or any combination of the foregoing items). For example, as shown in FIG. 2A, the connecting module 206 includes two protrusions that are received in respective recesses in the first board 202. In some embodiments, the protrusions and the recesses include solder tabs so that the first board 202 can be soldered to the connecting module 206, thus forming at least a mechanical connection between the boards 202, 206. In some embodiments, the solder tabs also form an electrical connection between the boards 202, 206 (e.g., for power and ground signals, or any other appropriate electrical signal). Fastener(s) 224 are described in greater detail herein with reference to FIGS. 4A-4C.

By joining the connecting module 206 to the first board 202, the assembly 200 forms a channel (e.g., channel 214) that is bounded by the first board, second board, and connecting module 202, 204, 206, as well as any flexible interconnects that couple the boards to one another (e.g., flexible interconnects 211, 212). Thus, a channel is formed without the need for external supports, rails, brackets, or other hardware, reducing the cost and complexity of the assembly 200 while still providing the increased cooling capacity that is made possible by such a channel. In particular, because the channel 214 can be formed simply by joining the first board 202 and the connecting module 206, the assembly 200 can be more easily manufactured than structures that require more complicated mounting hardware. Moreover, because the entire assembly 200 can be soldered together (e.g., the flexible interconnects 211, 212 may be soldered to their respective boards, and the first board 202 may be soldered to the connecting module 206), the resulting assembly is more robust than an assembly that uses less secure mounting or attachment techniques. Specifically, the soldered connections may be more resistant to separation or loosening caused by the heating and cooling cycles that are frequently present in computer hardware.

As shown in FIG. 2A, the channel 214 is supported in some places by a flexible interconnect. For example, the flexible interconnect 211 joins the first board 202 and the second board 204, and, when the assembly is formed into a channel 214, the flexible interconnect 211 provides structural support to keep the first board 202 separate from the second board 204. Similarly, the flexible interconnect 212 that joins the second board 204 and the connecting module 206, although smaller than the flexible interconnect 211 also supports the assembly 200 to maintain the structural integrity of the channel 214. Although the flexible interconnects 211, 212 are rigid enough to maintain separation of the first board 202 and the connecting module 204 when the assembly is completed, they are flexible enough to provide a pliable joint so that the boards can be moved with respect to one another without damaging the connections. This allows the boards to be manipulated with respect to one another for ease of installation and assembly. For example, the assembly 200 may be mounted to a base board (e.g., base board 208, FIG. 2B) when the first board 202 and the connecting module 206 are separate. The first board 202 is then folded over the second board 204 such that the first and second boards 202, 204 are substantially parallel to one another. The connecting module 206 is then coupled to the first board 202 to form the channel 214. Thus, the flexible interconnects 211, 212 (and any other flexible interconnect that may be used to join boards in an assembly in accordance with the present ideas) are flexible enough to allow the boards to be moved relative to one another, but are rigid enough to support the channel 214 under normal operating conditions and orientations (e.g., so that the channel 214 does not collapse).

In some embodiments, multiple assemblies 200 are combined to form a substantially continuous channel. For example, in some embodiments, several assemblies 200 are coupled to one or more base boards such that the respective channels 214 are substantially aligned, thus allowing air to pass through the respective channels. In some embodiments, where multiple assemblies 200 form a single channel, the assemblies 200 are coupled to one another so as to form a substantially continuous channel. For example, in some embodiments, gaskets, seals, rails, or any other appropriate components, are positioned between two adjacent assemblies in order to prevent air from escaping the channel.

FIG. 2B is a side view of the assembly 200. As shown in FIG. 2B, the first board, second board, and connecting module 202, 204, 206 have been positioned so as to form the channel 214. FIG. 2B also illustrates a base board 208 (e.g., a mother board) to which the assembly 200 is mechanically and/or electrically coupled. In some embodiments, the assembly 200 includes one or more fastener(s) 222 in or coupled to the second board 204 to facilitate such a coupling. For example, in some embodiments, the one or more fastener(s) 222 include one or more threaded nuts embedded into the board 204, into which mounting screws on the base board 208 are threaded in order to couple the assembly 200 to the base board 208. In some embodiments, the one or more fastener(s) 222 are selected from the group consisting of: a screw, a nut (e.g., a PEM nut), a bolt, a grid array (e.g., ball grid array, pin grid array, etc.), wires, pins (e.g., dual-in-line, quad-in-line, etc.), a standoff, a clip, a flexible interconnect, a solder tab, a solder joint, and adhesive. Other appropriate fasteners or fastening techniques may also be used.

Figure 2D:
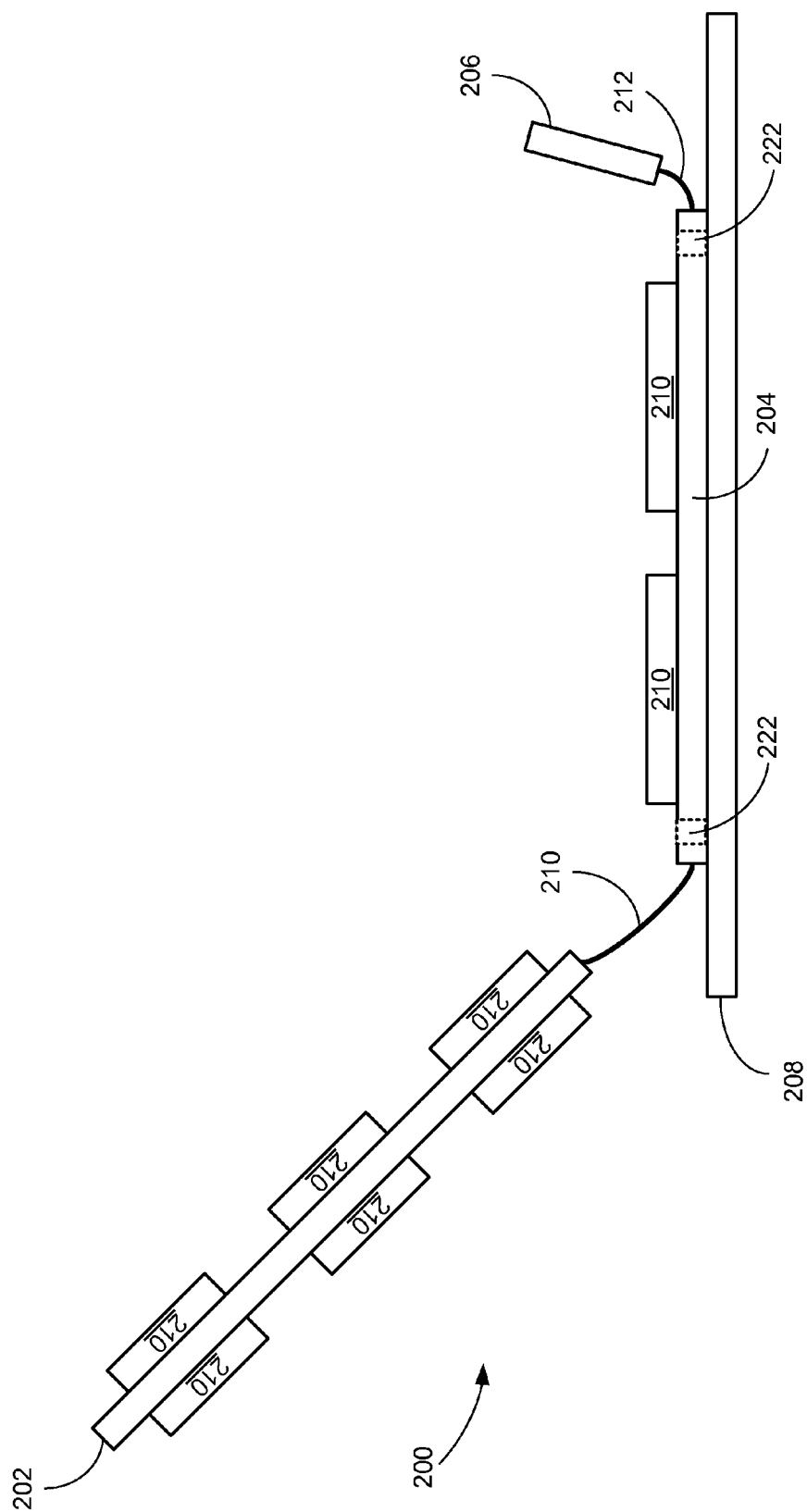

FIG. 2C is a side view of the assembly 200 where the first board 202 is not coupled to the connecting module 206. FIG. 2D is another side view of the assembly 200 where the first board 202 is not coupled to the connecting module 206, and the first board 202 is at an obtuse angle with respect to the second board 204. This orientation facilitates mounting the assembly 200 to the base board 208, because the surface of the second board 204 is easily accessible. In particular, when the assembly 200 is closed and the channel 214 is formed, it would be more difficult to access the surface of the second board 204 in order to facilitate mounting. In some embodiments, the first board and connecting module 202, 206 can be decoupled after they have been coupled to facilitate maintenance or removal of the assembly. For example, the assembly 200 can be opened so that dust, particulate, or other contaminants deposited as a result of airflow through the channel 214 can be removed. In some embodiments, the one or more fastener(s) 224 (not shown in FIGS. 2B-2D) are configured to allow the first board and connecting module 202, 206 to be decoupled without destroying the assembly 200 (e.g., with a spring clip, screws, etc.). In some embodiments, where the first board 202 and the connecting module 206 are soldered together (e.g., the fasteners(s) 224 include solder pads that have been soldered together), the first board 202 and the connecting module 206 can be decoupled by desoldering the boards.

Figure 3A:
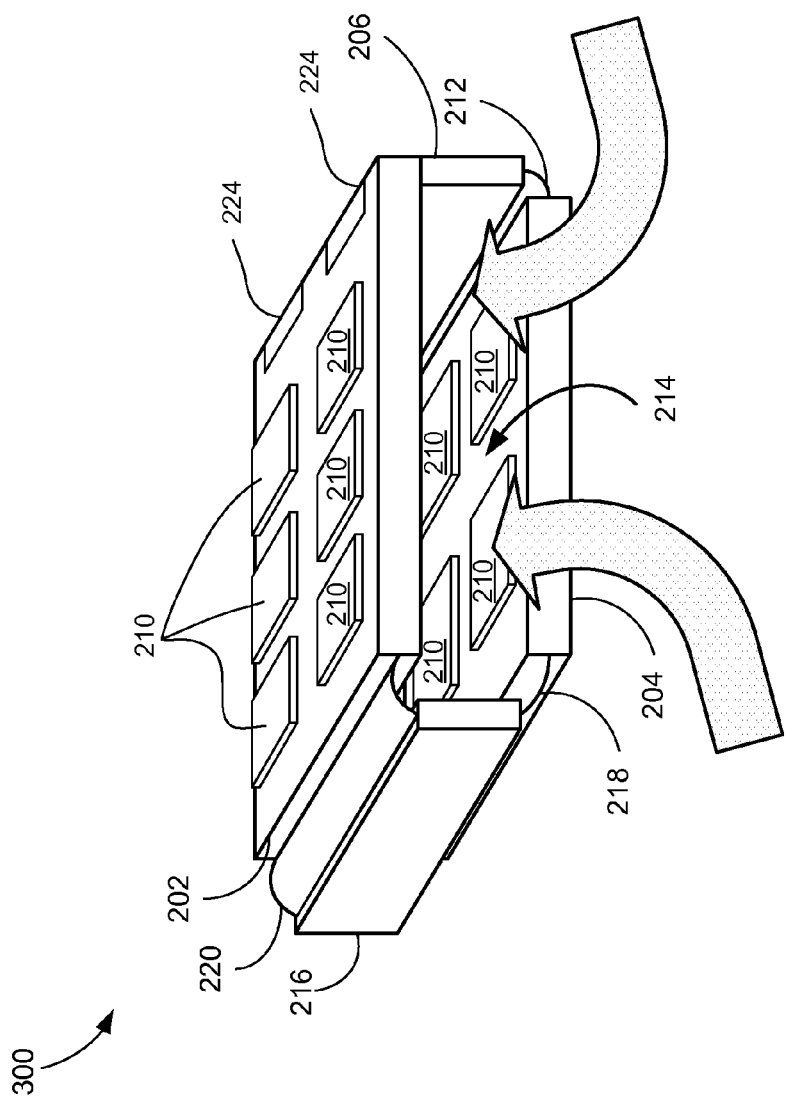
FIG. 3A is an oblique view of another exemplary electronic assembly that forms a self supporting channel, in accordance with some embodiments.

FIG. 3A illustrates an embodiment of an electronic assembly 300 ("assembly 300"), in which the assembly 300 forms a self supporting channel. The assembly 300 includes many of the same components as the assembly 200 illustrated in FIGS. 2A-2D (e.g., electronic components 210, first board 202, second board 204, connecting module 206, etc.), and the details and explanations provided above for these components are incorporated by reference to assembly 300, and are not repeated here.

While the assembly 200 (FIG. 2A) included a flexible interconnect 211 that mechanically and/or electrically coupled the first board 202 to the second board 204, the assembly 300 (FIG. 3A) includes a fourth circuit board 216 that is coupled to the first board 202 and the second board 202 by flexible interconnects 218 and 220. The addition of the fourth board 216 can add a degree of rigidity to the assembly that might be beneficial in some applications. For example, in some embodiments, the flexible interconnect 211 of in the assembly 200 is not rigid enough to support the channel 214. This may occur if the channel 214 is too large or the first board 202 is too heavy to be supported by the flexible interconnect 211. Furthermore, the addition of the fourth board 216 provides more surface area on which electronic components 210 can be mounted. Thus, a more compact, densely packed electronic assembly can be provided without increasing the overall size of the assembly.

While the fourth board 216 is coupled to both the first and second boards 202, 204 with flexible interconnects (220 and 218, respectively), in some embodiments, only one of these couplings is flexible. For example, the coupling between the first board 202 and the fourth board 216, or the coupling between the second board 204 and the fourth board 216, may be a rigid coupling. The rigid coupling between the fourth board 216 and another board may be made using any appropriate technique using any appropriate fastener (e.g., as described above with reference to the fasteners in FIG. 2A, and below with reference to the fasteners in FIGS. 4A-4C).

FIGS. 3B and 3C are side views of the assembly 300. As shown in FIG. 3B, the first board 202, the second board 204, the connecting module 206, and the fourth board 216 have been positioned so as to form the channel 214. In FIG. 3C the first board 202 is not coupled to the connecting module 206. FIG. 3D is another side view of the assembly 300 where the first board 202 is not coupled to the connecting module 206, and the first board 202 is at an obtuse angle with respect to the second board 204. This orientation facilitates mounting the assembly 300 to the base board 208, because the surface of the second board 204 is easily accessible.

Figure 4A:
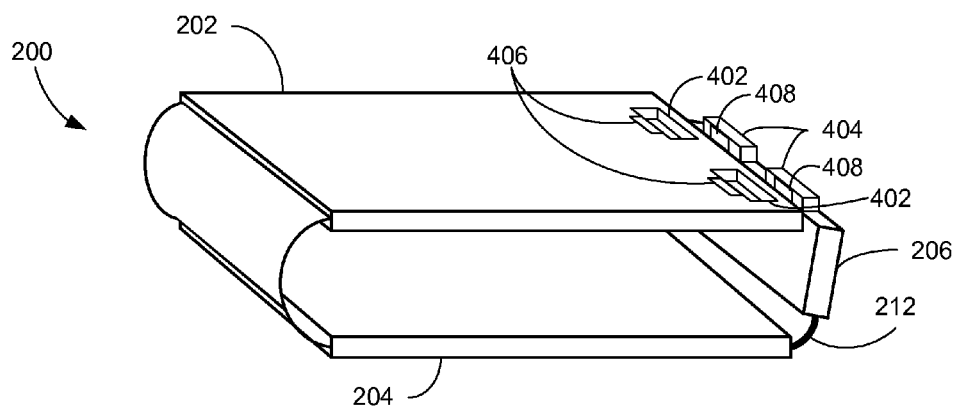
FIGS. 4A-4C are oblique views of an exemplary electronic assembly with various fastener configurations, in accordance with some embodiments.
Figure 4B:
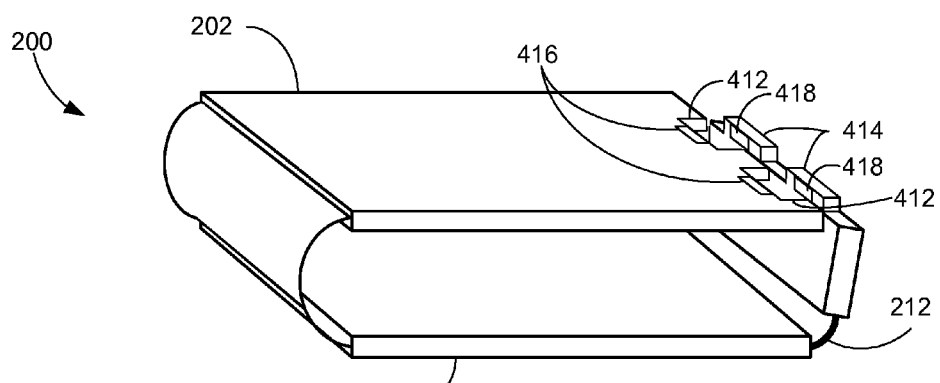
Figure 4C:
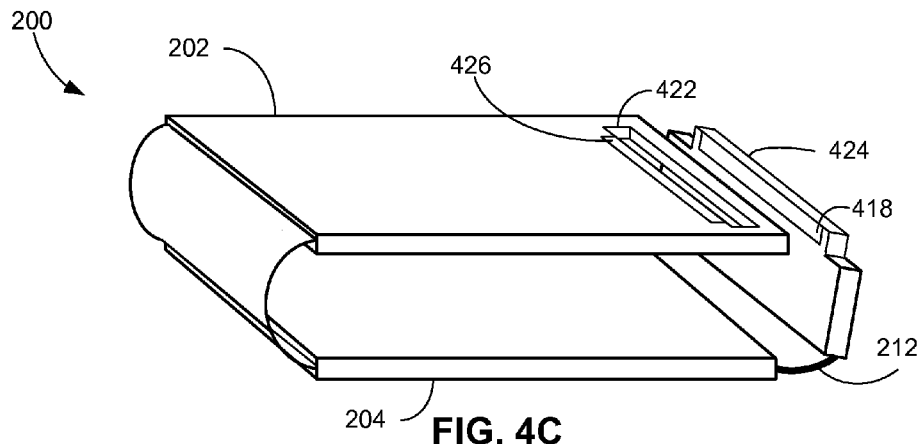

FIGS. 4A-4C illustrate embodiments of the assembly 200 with variations on the one or more fastener(s) 224 used to couple the first board 202 with the connecting module 206. For example, FIG. 4A illustrates the assembly 200 as depicted in FIG. 2A, where the first board 202 includes holes 402, and the connecting module includes protrusions 404 that are configured to mate with (e.g., fit within) the holes 402. The holes 402 are any suitable shape, including round, square, rectangular, oblong, or the like.

In some embodiments, the holes 402 include solder tabs 406, and the protrusions include solder tabs 408 for coupling to the solder tabs 406. (It will be recognized that more or fewer solder tabs than those shown in FIG. 4A may be included on the holes or the protrusions.) In some embodiments, when the first board 202 is coupled to the connecting module 206, the solder tabs 406, 408 are soldered together in order to securely couple the first board 202 to the connecting module 206. In some embodiments, this causes the first board 202 and the connecting module 206 to be electrically coupled as well. In some embodiments, the soldering causes the first board 202 to be electrically coupled to the second board 204 (e.g., via the flexible interconnect 212).

In some embodiments, the soldering is only used to mechanically couple the first board 202 to the connecting module 206 (e.g., no electrical signals are intended to be transmitted between the first board 202 and the connecting module 206 via the solder tabs 406, 408).

While FIG. 4A illustrates two holes and two corresponding protrusions, it will be understood that this is merely exemplary, and more or fewer holes and corresponding protrusions may be used as well (e.g., 3, 4, 5, 10, etc.).

FIG. 4B illustrates the assembly 200 where the first board 202 includes notches 412, and the connecting module includes protrusions 414 that are configured to mate with (e.g., fit within) the notches 412. The notches 412 are any suitable shape, including round, square, rectangular, oblong, or the like.

In some embodiments, the notches 412 include solder tabs 416, and the protrusions include solder tabs 418 for coupling to the solder tabs 416. (It will be recognized that more or fewer solder tabs than those shown in FIG. 4B may be included on the holes or the protrusions.) Solder tabs 416 and 418 are analogous to solder tabs 406, 408, and the description of the structure and function of solder tabs 406, 408 applies equally to solder tabs 416 and 418, and will not be repeated here.

FIG. 4C illustrates the assembly 200 where the first board 202 includes a slot 422 (e.g., an elongated hole), and the connecting module includes a protrusion 424 that is configured to mate with (e.g., fit within) the slot 422.

In some embodiments, the slot 422 includes a solder tab 426, and the protrusion includes a solder tab 428 for coupling to the solder tabs 426. (It will be recognized that more or fewer solder tabs than those shown in FIG. 4C may be included on the slot or the protrusion.) Solder tabs 422 and 426 are analogous to solder tabs 406, 408, and the description of the structure and function of solder tabs 406, 408 applies equally to solder tabs 416 and 418, and will not be repeated here.

In FIGS. 4A-4C, the protrusions, holes, slots, notches, and solder pads may all be considered fasteners or components of fasteners. Moreover, other fastener components not described or shown in FIGS. 4A-4C may also be used to aid in coupling the first board 202 to the connecting module 206 (e.g., screws, snaps, clips, adhesive, brackets, magnets, etc.).

Figure 5:
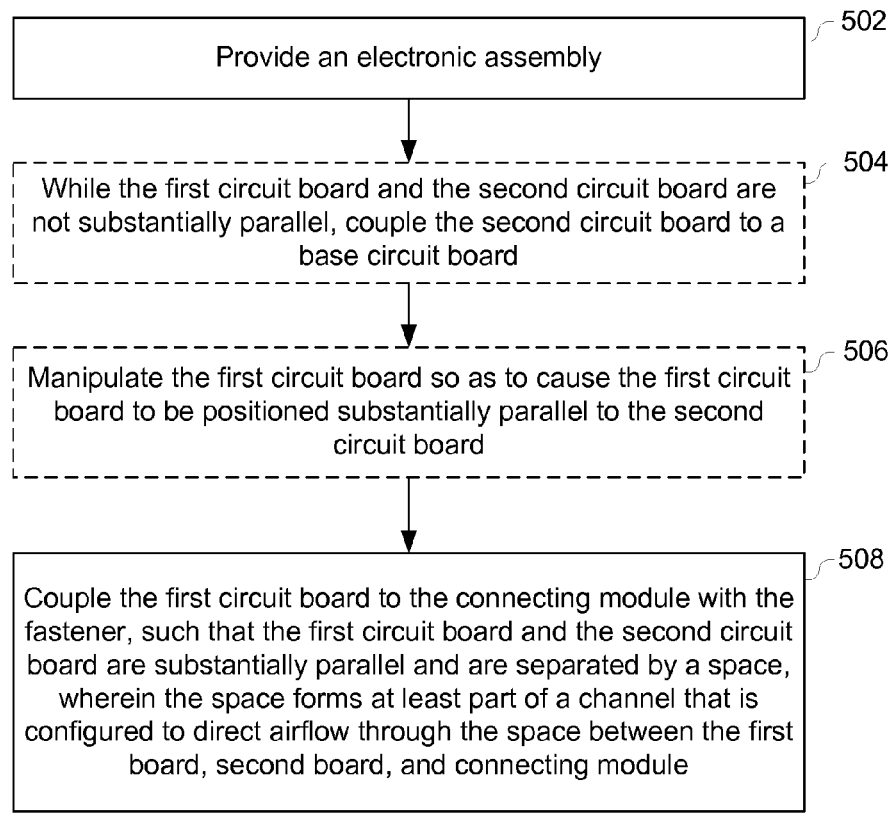
FIG. 5 illustrates an exemplary flow chart of a method for assembling an electronic assembly, in accordance with some embodiments.

FIG. 5 illustrates an exemplary flow chart of a method 500 for manufacturing an electronic assembly for dissipating heat, according to some embodiments. A first electronic assembly is provided (502). The electronic assembly includes a first circuit board (e.g., the first circuit board 202), a second circuit board (e.g., the second circuit board 204), a connecting module (e.g., a third circuit board), and a fastener (e.g., the one or more fastener(s) 224).

In some embodiments, while the first circuit board and the second circuit board are not substantially parallel, the second circuit board is coupled to a base circuit board (e.g., base board 208) (504). The electronic assembly (e.g., the first circuit board) is then manipulated (e.g., by machine or by hand) so as to cause the first circuit board to be positioned substantially parallel to the second circuit board (506). Manipulating the first circuit board so as to cause the first circuit board to be positioned substantially parallel to the second circuit board causes at least a portion of a first flexible interconnect coupling the first circuit board to the second circuit board (e.g., the flexible interconnect 211) to be deformed or bent.

In some embodiments, the connecting module is manipulated so as to cause the connecting module to be positioned substantially perpendicular to the second circuit board (e.g., as shown in FIG. 2A, wherein manipulating the connecting module causes at least a portion of a second flexible interconnect coupling the connecting module to the second circuit board (e.g., flexible interconnect 212) to be deformed (506).

The first circuit board is coupled to the connecting module with the fastener (e.g., the one or more fastener(s) 224), such that the first circuit board and the second circuit board are substantially parallel and are separated by a space, wherein the space forms at least part of a channel (e.g., channel 214)

that is configured to direct airflow through the space between the first circuit board, second circuit board, and connecting module (508).

Figure 6:
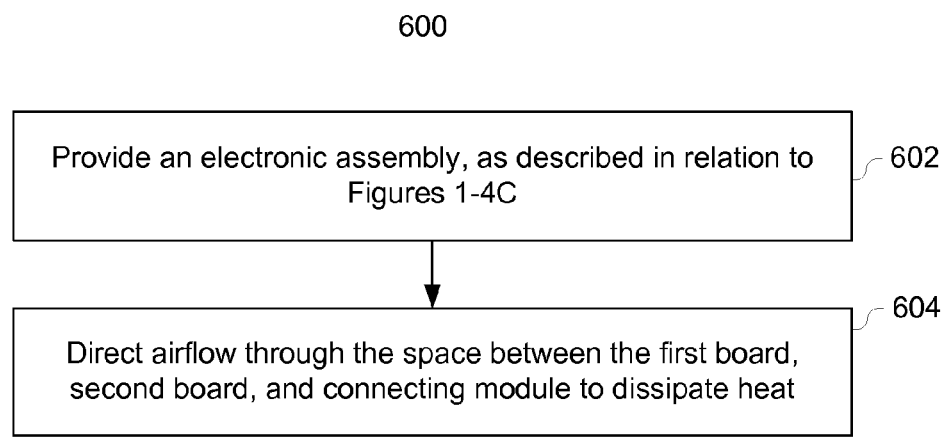
FIG. 6 illustrates an exemplary flow chart of a method for dissipating heat in an electronic assembly, in accordance with some embodiments.

FIG. 6 illustrates an exemplary flow chart of a method 600 for dissipating heat in an electronic assembly, in accordance with some embodiments. An electronic assembly, as described above in relation to FIGS. 1-4C is provided (602). In some embodiments, the electronic assembly includes a first circuit board, a second circuit board, and a fastener. The second circuit board is flexibly coupled to the first circuit board. The connecting module is coupled to the second circuit board. The fastener couples the first circuit board to the connecting module such that the first circuit board and the second circuit board are substantially parallel and are separated by a space.

In some embodiments, at least one of the first circuit board and the second circuit board comprises one or more solid state drives (SSDs). In some embodiments, at least one of the first circuit board and the second circuit board comprises one or more three-dimensional (3D) memory devices.

Thereafter, airflow is directed (604) through the space between the first circuit board, second circuit board, and connecting module to dissipate heat, as described above, i.e., air is passed through the channel.

A person skilled in the art will recognize that the invention or inventions descried and claimed herein are not limited to the two dimensional and three dimensional exemplary structures described here, and instead cover all relevant memory structures suitable for implementing the invention or inventions as described herein and as understood by one skilled in the art.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. An electronic assembly for dissipating heat, comprising:
    a first circuit board including a first fastener;
    a second circuit board flexibly coupled to the first circuit board; and
    a connecting module including a rigid board that has a first edge flexibly coupled to the second circuit board and a second edge opposite the first edge, the second edge of the rigid board further including a second fastener that is distinct from the first fastener of the first circuit board, the second fastener configured to be received within the first fastener for coupling the rigid board directly to the first circuit board at a substantially right angle;
    wherein the first and second fasteners are configured to couple the first circuit board to the connecting module such that the first circuit board and the second circuit board are substantially parallel and are separated by a space, wherein the space forms at least part of a channel that is configured to direct airflow through the space between the first circuit board, second circuit board, and connecting module.

2. The electronic assembly of claim 1, wherein the first circuit board is flexibly coupled to the second circuit board with a flexible interconnect.

3. The electronic assembly of claim 2, wherein the flexible interconnect electrically couples the first circuit board to the second circuit board.

4. The electronic assembly of claim 3, wherein a first side of the channel comprises the connecting module, and a second side of the channel comprises the flexible interconnect.

5. The electronic assembly of claim 1, wherein the first circuit board is flexibly coupled to the second circuit board with one or more flexible interconnects and one or more additional circuit boards.

6. The electronic assembly of claim 1, wherein the second circuit board is flexibly coupled to the connecting module.

7. The electronic assembly of claim 6, wherein the second circuit board is flexibly coupled to the connecting module with a flexible interconnect.

8. The electronic assembly of claim 1, wherein at least one of the first circuit board and the second circuit board includes one or more three-dimensional (3D) memory devices.

9. The electronic assembly of claim 7, wherein the flexible interconnect electrically couples the second circuit board to the connecting module.

10. The electronic assembly of claim 1, wherein the first circuit board includes two opposite surfaces, and a plurality of electronic components are disposed on both of the two opposite surfaces of the first circuit board.

11. The electronic assembly of claim 1, wherein the electronic assembly is mounted on a base board, and the first and second circuit boards are substantially parallel to the base board.

12. The electronic assembly of claim 1, wherein the first fastener is selected from a group consisting of holes, notches and slots.

13. The electronic assembly of claim 1, wherein the first and the second fasteners each comprise one or more solder pads.

14. The electronic assembly of claim 1, wherein the first circuit board includes a hole in a substrate of the first circuit board, and the connecting module includes a protrusion configured to mate with the hole in the first circuit board.

15. The electronic assembly of claim 1, wherein the connecting module includes a hole in a substrate of the connecting module, and the first circuit board includes a protrusion configured to mate with the hole in the connecting module.

16. The electronic assembly of claim 1, wherein the first circuit board includes a notch in a substrate of the first circuit board, and the connecting module includes a protrusion configured to mate with the notch in the first circuit board.

17. The electronic assembly of claim 1, wherein the connecting module includes a notch in a substrate of the connecting module, and the first circuit board includes a protrusion configured to mate with the notch in the connecting module.

18. The electronic assembly of claim 1, wherein the first and second fasteners are configured to mechanically and electrically couple the first circuit board to the second circuit board.

19. The electronic assembly of claim 1, wherein the second circuit board includes one or more third fasteners configured to couple the second circuit board to a base board.

20. The electronic assembly of claim 1, wherein at least one of the first circuit board, second circuit board, and connecting module comprises one or more solid state drives (SSDs) or energy hold capacitor circuitry.

21. A method of manufacturing an electronic assembly for dissipating heat, comprising:
  providing an electronic assembly, comprising:
    a first circuit board including a first fastener;
    a second circuit board flexibly coupled to the first circuit board; and
    a connecting module including a rigid board that has a first edge flexibly coupled to the second circuit board and a second edge opposite the first edge, the second edge of the rigid board further including a second fastener that is distinct from the first fastener of the first circuit board, the second fastener configured to be received within the first fastener for coupling the rigid board directly to the first circuit board at a substantially right angle; and
  coupling the first circuit board to the connecting module with the first and second fasteners, such that the first circuit board and the second circuit board are substantially parallel and are separated by a space, wherein the space forms at least part of a channel that is configured to direct airflow through the space between the first circuit board, second circuit board, and connecting module.

22. The method of claim 21, further comprising, prior to coupling the first circuit board to the connecting module:
  while the first circuit board and the second circuit board are not substantially parallel, coupling the second circuit board to a base circuit board; and
  manipulating the electronic assembly so as to cause the first circuit board to be positioned substantially parallel to the second circuit board, wherein manipulating the electronic assembly so as to cause the first circuit board to be positioned substantially parallel to the second circuit board causes at least a portion of a first flexible interconnect coupling the first circuit board and the second circuit board to be deformed.

23. The method of claim 22, wherein the connecting module is flexibly coupled to the second circuit board, the method further comprising, prior to manipulating the first circuit board:
  manipulating the electronic assembly so as to cause the connecting module to be positioned substantially perpendicular to the second circuit board, wherein manipulating the electronic assembly causes at least a portion of a second flexible interconnect coupling the connecting module to the second circuit board to be deformed.

24. The method of claim 21, wherein at least one of the first circuit board and the second circuit board comprises one or more three-dimensional (3D) memory devices, one or more solid state drives (SSDs), or energy hold capacitor circuitry.

* * * * *